United States Patent
Ko et al.

(10) Patent No.: US 11,222,939 B2
(45) Date of Patent: Jan. 11, 2022

(54) DISPLAY PANEL, DISPLAY DEVICE AND METHOD FOR MANUFACTURING DISPLAY PANEL

(71) Applicants: BOE TECHNOLOGY GROUP CO., LTD., Beijing (CN); CHENGDU BOE OPTOELECTRONICS TECHNOLOGY CO., LTD., Sichuan Province (CN)

(72) Inventors: Young Yik Ko, Beijing (CN); Xiangdan Dong, Beijing (CN); Jinsan Park, Beijing (CN); Wenbao Gao, Beijing (CN); Guobo Yang, Beijing (CN); Haijun Qiu, Beijing (CN); Wanli Dong, Beijing (CN); Benlian Wang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 691 days.

(21) Appl. No.: 16/080,346

(22) PCT Filed: Sep. 29, 2017

(86) PCT No.: PCT/CN2017/104546
§ 371 (c)(1),
(2) Date: Aug. 28, 2018

(87) PCT Pub. No.: WO2018/176780
PCT Pub. Date: Oct. 4, 2018

(65) Prior Publication Data
US 2021/0202649 A1    Jul. 1, 2021

(30) Foreign Application Priority Data
Mar. 31, 2017    (CN) .......................... 201710209799.9

(51) Int. Cl.
*H01L 27/32* (2006.01)
*H01L 51/52* (2006.01)
(Continued)

(52) U.S. Cl.
CPC ...... *H01L 27/3276* (2013.01); *H01L 51/5246* (2013.01); *H01L 51/56* (2013.01);
(Continued)

(58) Field of Classification Search
CPC . H01L 27/3276; H01L 51/5246; H01L 51/56; H01L 2227/323; H05K 2201/10128
See application file for complete search history.

(56) References Cited

U.S. PATENT DOCUMENTS 9,064,708 B2    6/2015 Kwack et al.
9,535,302 B2    1/2017 Lee
(Continued)

FOREIGN PATENT DOCUMENTS

| CN | 103779378 A | 5/2014 |
| CN | 103811529 A | 5/2014 |

(Continued)

OTHER PUBLICATIONS

International Search Report and Written Opinion for International Application No. PCT/CN2017/104546 dated Dec. 27, 2017.

*Primary Examiner* — Seahvosh Nikmanesh
(74) *Attorney, Agent, or Firm* — Calfee, Halter & Griswold LLP (57) ABSTRACT

A display panel includes a display substrate, a chip-on-film provided at a bezel away from a display face of the display substrate, an insulation adhesive filled between the display substrate and the chip-on-film, and an integrated circuit chip fixed at a side of the chip-on-film away from the display substrate, the chip-on-film is fixed at the bezel away from the display face of the display substrate by the insulation (Continued)

adhesive, at the bezel there are a plurality of connection holes penetrating through the display substrate and the insulation adhesive, and conductive material filled in the respective connection holes, and signal lines at the bezel at the display face of the display substrate are connected with connection terminals provided at a side of the chip-on-film facing the display substrate via the conductive material.

16 Claims, 6 Drawing Sheets

(51) Int. Cl.
    *H05K 1/18*        (2006.01)
    *H01L 51/56*     (2006.01)

(52) U.S. Cl.
    CPC ........ *H05K 1/189* (2013.01); *H01L 2227/323* (2013.01); *H05K 2201/10128* (2013.01)

(56) References Cited

U.S. PATENT DOCUMENTS

| | | |
|---|---|---|
| 9,691,814 B2 | 6/2017 | Kim |
| 2014/0124803 A1 | 5/2014 | Kwack et al. |
| 2015/0076531 A1 | 3/2015 | Kim |
| 2015/0228706 A1 | 8/2015 | Lee |
| 2015/0230331 A1 | 8/2015 | Lee |
| 2018/0160545 A1* | 6/2018 | Kim ................. H05K 3/363 |
| 2018/0324964 A1* | 11/2018 | Yoo ................. G06F 1/1681 |

FOREIGN PATENT DOCUMENTS

| | | |
|---|---|---|
| CN | 104465604 A | 3/2015 |
| CN | 104835804 A | 8/2015 |
| CN | 205789985 U | 12/2016 |
| CN | 107093606 A | 8/2017 |

\* cited by examiner

DISPLAY PANEL, DISPLAY DEVICE AND METHOD FOR MANUFACTURING DISPLAY PANEL

CROSS REFERENCE

The present application is based on International Application No. PCT/CN2017/104546, filed on Sep. 29, 2017, which is based upon and claims priority to Chinese Patent Application No. 201710209799.9 titled "Display panel, display device and method for manufacturing display panel" and filed on Mar. 31, 2017, and the entire contents thereof are incorporated herein by reference.

TECHNICAL FIELD

The present disclosure relates to the technical field of display, in particular to a display panel, a display device and a method for manufacturing display panel.

BACKGROUND

With the increasing development of display technique, display panels have a more and more wide application in display products. Display products with a narrow bezel are appealing to a large number of consumers for providing users with good viewing experience.

Currently, pad bending is a feasible solution for display products with a narrow bezel. However, the display products fabricated by the pad bending process are involved with a big yield problem.

Accordingly, how to efficiently obtain a display product with a narrow bezel is a technical problem urgently to be solved.

SUMMARY

In embodiments of the disclosure there are provided a display panel, a display device and a method for manufacturing display panel.

In an embodiment of the disclosure there is provided a display panel comprising a display substrate, a chip-on-film provided at a bezel away from a display face of the display substrate, an insulation adhesive filled between the display substrate and the chip-on-film, and an integrated circuit chip fixed at a side of the chip-on-film away from the display substrate, wherein the chip-on-film is fixed at the bezel away from the display face of the display substrate by the insulation adhesive, at the bezel there are a plurality of connection holes penetrating through the display substrate and the insulation adhesive, and conductive material filled in the respective connection holes, and signal lines at the bezel at the display face of the display substrate are connected with connection terminals provided at a side of the chip-on-film facing the display substrate via the conductive material.

In a feasible embodiment, in the display panel according to the embodiment of the disclosure, the connection holes correspond to the connection terminals one to one, and the connection terminals have a size greater than an aperture of the connection holes.

In a feasible embodiment, in the display panel according to the embodiment of the disclosure, the aperture of the respective connections holes is equal to or greater than 25 μm.

In a feasible embodiment, in the display panel according to the embodiment of the disclosure, the conductive material is a metal material.

In a feasible embodiment, in the display panel according to the embodiment of the disclosure, the display substrate is an organic light emitting diode or quantum dot light emitting diode.

In a feasible embodiment, the display panel according to the embodiment of the disclosure further comprises a flexible printed board bonded at a side of the chip-on-film facing the display substrate.

In an embodiment of the disclosure there is provided a display device comprising the display panel.

In an embodiment of the disclosure there is provided a method for manufacturing a display panel comprising:

mounting an integrated circuit chip at a chip-on-film;

attaching the chip-on-film at a bezel away from a display face of a display substrate by insulation adhesive, with the integrated circuit chip being positioned at a side of the chip-on-film away from the display substrate;

forming a plurality of connection holes penetrating through the display substrate and the insulation adhesive at the bezel at the display face of the display substrate; and filling conductive material into the respective connection holes such that signal lines positioned at the bezel at the display face of the display substrate are connected with connection terminals provided at a side of the chip-on-film facing the display substrate.

In a feasible embodiment, in the manufacturing method according to the embodiment of the disclosure, forming a plurality of connection holes penetrating through the display substrate and the insulation adhesive at the bezel at the display face of the display substrate comprises particularly:

using a laser drilling process to form the plurality of connection holes penetrating through the display substrate and the insulation adhesive at the bezel at the display face of the display substrate by controlling a diameter and energy of laser.

In a feasible embodiment, the manufacturing method according to the embodiment of the disclosure further comprises, simultaneously with mounting the integrated circuit chip at the chip-on-film:

bonding a reflex circuit board at the side of the chip-on-film away from the integrated circuit chip.

DETAILED DESCRIPTION

Now detailed description will be made for a display panel, a display device and a method for manufacturing a display panel in conjunction with the accompanying drawings.

In the accompanying drawings the size of thickness and shapes of the respective layers do not reflect a true scale of the display panel, and are only for purpose of illustrating the contents of the disclosure.

Figure 1:
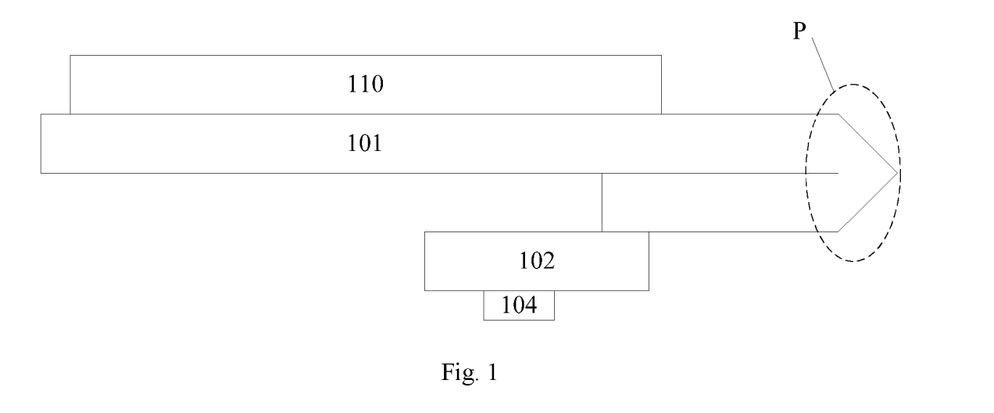
FIG. 1 is a schematic structural view of a display panel.

For example, as shown in FIG. 1, a display panel comprises a display substrate 101, a polarizer 110 provided on the display substrate 101, a chip-on-film 102 provided away from a display face of the display substrate 101, and an integrated circuit chip 104 fixed at a side of the chip-on-film 102 away from the display substrate 101. The display substrate 101 is connected with the chip-on-film 102 via a bent region of pad P. In an inorganic insulation layer of the bent region of pad P there may occur cracks which lead to failure. In the related art a mask process is added to remove the inorganic insulation layer of the bent region of pad P, and then another mask process is added to form an organic insulation layer at the bent region of pad P in order to avoid the phenomenon of display failure due to occurrence of cracks in the bent region of pad P. In doing so, although the phenomenon of display failure due to occurrence of cracks in the bent region of pad P is avoided to some extent, adding two mask processes increases process difficulties and fabrication cost and reduces producing efficiency. Moreover, formation of the bent region of pad P requires additional space, and in comparison with display products of the same size but not fabricated by the pad bending process, the display products fabricated by the pad bending process have a low usage of the base substrate.

Figure 2A:
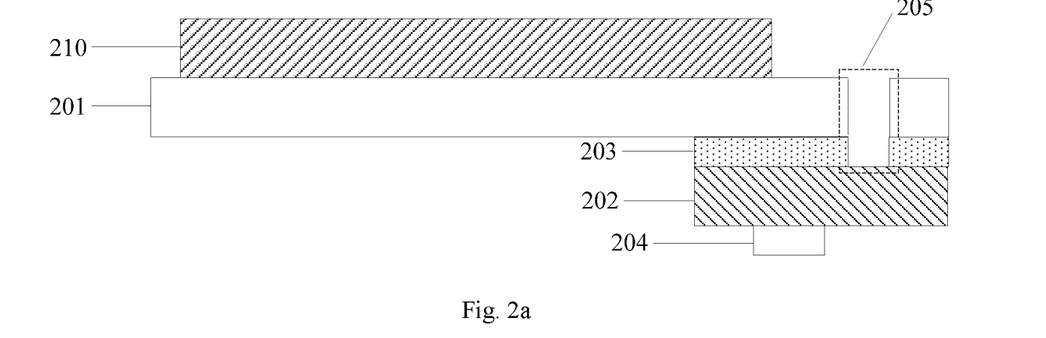
FIGS. 2a and 2b are schematic structural views of a display panel according to an embodiment of the disclosure, respectively.
Figure 2B:
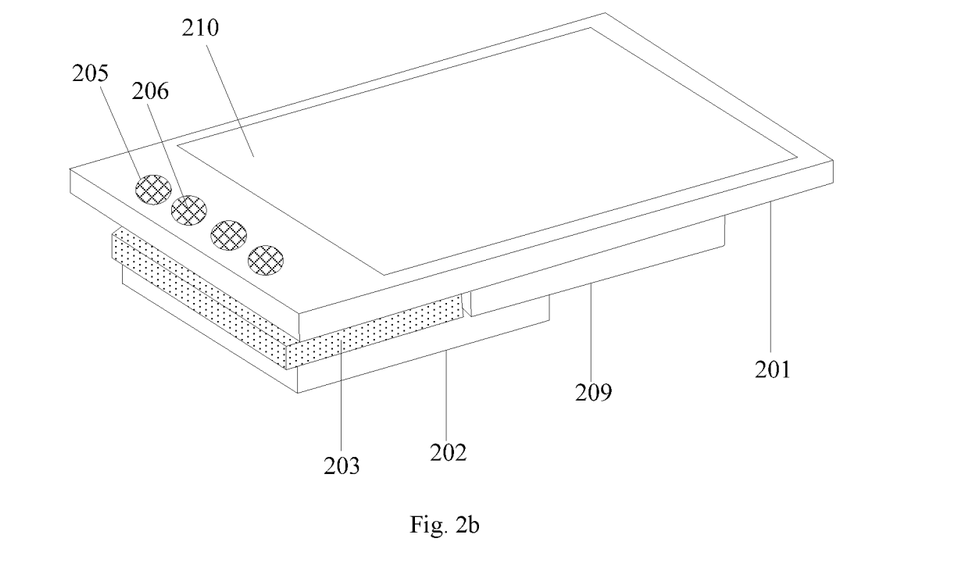

According to an embodiment of the disclosure, as shown in FIGS. 2a and 2b, a display panel comprises a display substrate 201, a chip-on-film 202 provided at a bezel away from a display face of the display substrate 201, insulation adhesive 203 filled between the display substrate 201 and the chip-on-film 202, and an integrated circuit chip 204 fixed at a side of the chip-on-film 202 away from the display substrate 201.

The chip-on-film 202 is fixed at the bezel away from the display face of the display substrate 201 by the insulation adhesive.

Figure 7:
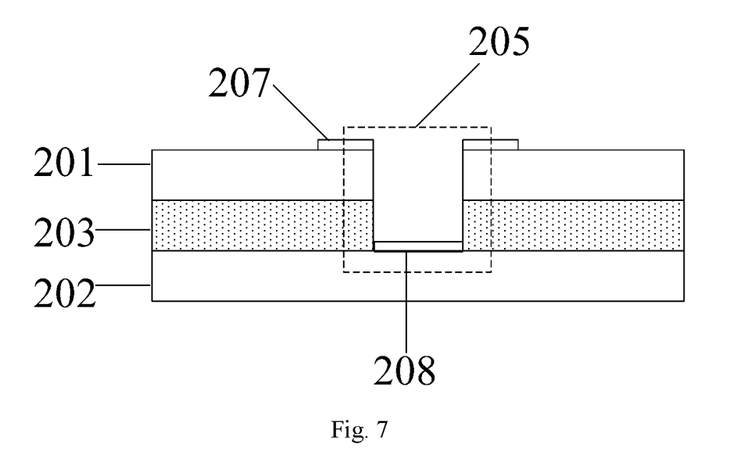
FIG. 7 is a schematic sectional view taken along a line AA in FIG. 6d.

At the bezel, there are a plurality of connection holes 205 penetrating through the display substrate 201 and the insulation adhesive 203, and conductive material 206 filled in the respective connection holes 205. Signal lines 207 at the bezel at the display face of the display substrate 201 are connected with connection terminals 208 provided at a side of the chip-on-film facing the display substrate 201 via the conductive material 206, as shown in FIG. 7.

In the display panel according to the embodiment of the disclosure, since the insulation adhesive 203 is used to attach the chip-on-film 202 at the bezel away from the display face of the display substrate 201 and then the connection between the signal lines 207 at the bezel at the display face of the display substrate 201 and the connection terminals 208 at the side of the chip-on-film 202 facing the display substrate 201 is performed by the conductive material 206 in the plurality of connection holes 205 penetrating through the display substrate 201 and the insulation adhesive 203, not only is the pad bending process omitted, but also there is not a bent region of pad at the bezel of the display panel, such that the lower bezel of the display panel may become narrower. Since the connection holes 205 only penetrate through the display substrate 201 and the insulation adhesive 203, surface contact between the conductive material 206 filled in the connection holes 205 and the connection terminals 208 may be achieved, and thus the contact resistance is effectively reduced.

Figure 3:
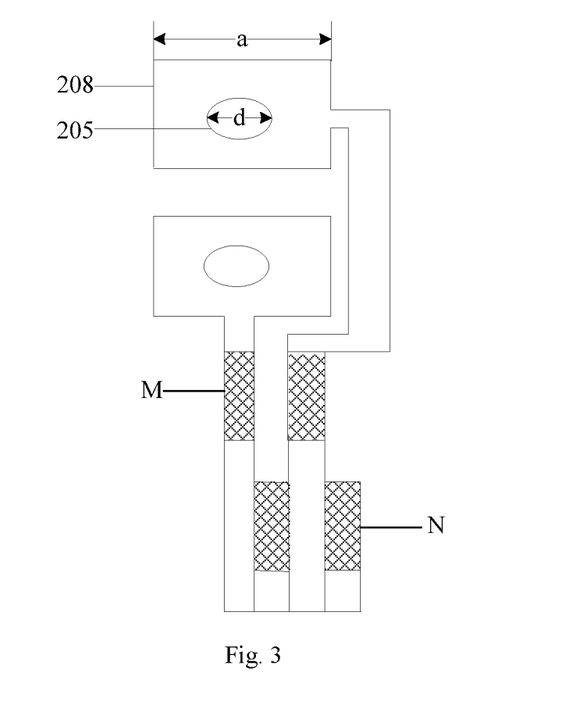
FIG. 3 is a schematic structural view of connection holes and connection terminals according to an embodiment of the disclosure.
Figure 4:
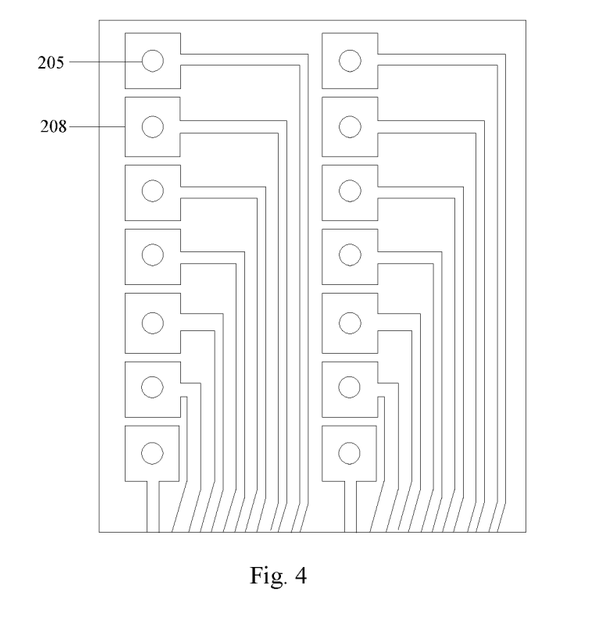
FIG. 4 is a schematic view of connection relationship between signal lines at a bezel at a display face of the display substrate and connection terminals provided at a side of a chip-on-film facing the display substrate according to an embodiment of the disclosure.

In practice, in order to facilitate connection between the signal lines 207 at the bezel at the display face of the display substrate 201 and the connection terminals 208 at the side of the chip-on-film 202 facing the display substrate 201, in the display panel according to the embodiment of the disclosure, as shown in FIGS. 3 and 4, the connection holes 205 may correspond to the connection terminals 208 one to one, and the size a of the connection terminals 208 is larger than the aperture d of the connection holes 205.

It should be noted that in the display panel according to the embodiment of the disclosure, the connection terminals 208 may have an arbitrary shape of such as triangle, square or circle to which there is not limitation. Further, when the connection terminals 208 have a shape of circle, the diameter of the connection terminals 208 is larger than the aperture d of the connection holes 205. When the connection terminals 208 have a shape of square, the side a of the connection terminals 208 is larger than the aperture d of the connection holes 205.

Furthermore, the display panel according to the embodiment of the disclosure, as shown in FIG. 3, may further comprise terminals, as shown by the hatched portions in the FIG. 3, configured to connect with pins of the integrated circuit chip 204. The terminal M connected with the connection terminal 208 via wire is typically provided at the same layer as the connection terminal 208, while the terminal N not connected with the connection terminal 208 may be provided either at the same layer as the connection terminal 208 or at a different layer from the connection terminal 208, to which there is no limitation.

Typically, the connection terminals 208 at the side of the chip-on-film 202 facing the display substrate 201 have a big amount and a high density. In order to fabricate rapidly and high efficiently the connection holes 205 corresponding to the connection terminals 208 one to one, in the display panel according to the embodiment of the disclosure, the laser drilling process may be used. And the connection holes 205 having an aperture and depth as desired may be obtained by controlling the diameter and energy of laser. Of course, the connection holes 205 may alternatively be fabricated by other drilling processes known to those skilled in the art, to which there is no limitation.

In the display panel according to the embodiment of the disclosure, as shown in FIG. 3, the connection holes 205 may have an aperture d which is equal to or greater than 25 μm, i.e., the minimum of the aperture d of the connection holes 205 may be 25 μm.

In practice, in the display panel according to the embodiment of the disclosure, the conductive material 206 may be a metal material. The conductive material 206 may be alternatively other materials having a conductive performance, such as Indium Tin Oxide, Indium Zinc Oxide or graphene, to which there is no limitation.

In practice, in the display panel according to the embodiment of the disclosure, the display substrate 201 may particularly be a display substrate of any mode. Preferably, the display substrate 201 may be a flexible display substrate such as organic light emitting diodes (OLED) or quantum dot light emitting diodes (QLED), to which there is no limitation.

Typically, electric charges and control signals necessary to drive the pixels in the display panel both come from an externally connected flexible printed circuit (FPC) and are transferred into the display panel via the chip-on-film 202. Accordingly, the display panel according to the embodiment of the disclosure, as shown in FIG. 2b, may further comprise a flexible printed board 209 bonded at a side of the chip-on-film 202 facing the display substrate 201.

Furthermore, in order to allow the display panel to display images, the display panel according to the embodiment of the disclosure, as shown in FIG. 2b, may further comprise a polarizer 210 attached at a display area of the display face of the display substrate 201.

Based on the same inventive concept, in an embodiment of the disclosure there is provided a method for manufacturing a display panel. Since the principle for the manufacturing method solving problems is similar to the principle for the display panel solving problems, embodiment of the display panel according to an embodiment of the disclosure may be referred to for embodiment of the manufacturing method according to an embodiment of the disclosure. The repeated contents will not be described.

Figure 5:
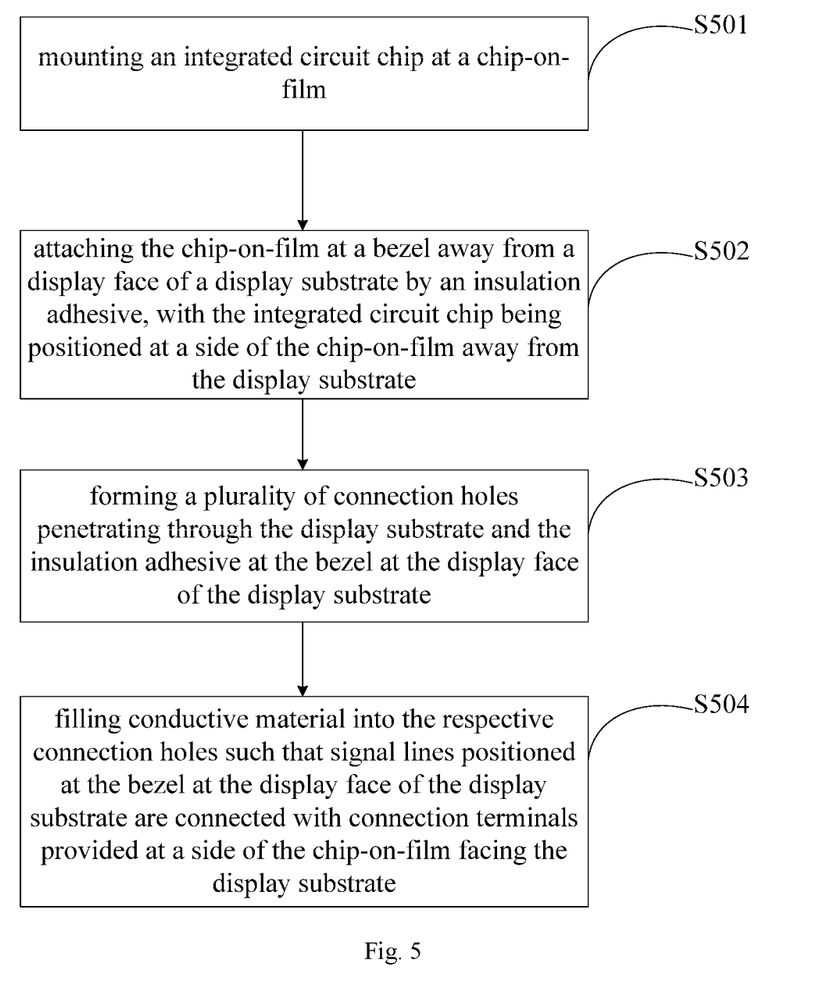
FIG. 5 is flow chart of a method for manufacturing a display panel according to an embodiment of the disclosure.

In particular, the method for manufacturing a display panel according to an embodiment of the disclosure, as shown in FIG. 5, may comprise the steps of:

S501: an integrated circuit chip is mounted at a chip-on-film;

S502: the chip-on-film is attached at a bezel away from a display face of a display substrate by insulation adhesive, with the integrated circuit chip being positioned at a side of the chip-on-film away from the display substrate;

S503: a plurality of connection holes penetrating through the display substrate and the insulation adhesive are formed at the bezel at the display face of the display substrate; and S504: conductive material is filled into the respective connection holes such that signal lines positioned at the bezel at the display face of the display substrate are connected with connection terminals provided at a side of the chip-on-film facing the display substrate.

In practice, in the manufacturing method according to the embodiment of the disclosure, the step S504 of forming a plurality of connection holes penetrating through the display substrate and the insulation adhesive at the bezel at the display face of the display substrate may comprise particularly: using a laser drilling process to form the plurality of connection holes penetrating through the display substrate and the insulation adhesive at the bezel at the display face of the display substrate by controlling a diameter and energy of laser.

In practice, the connection holes 205 may be alternatively fabricated by other drilling processes known to those skilled in the art, to which there is no limitation.

In practice, in the manufacturing method according to the embodiment of the disclosure, simultaneously with the step of mounting the integrated circuit chip at the chip-on-film, the following step may be performed:

a reflex circuit board is bonded at a side of the chip-on-film away from the integrated circuit chip.

In order to better understand the disclosure, schematic structural views of display panels obtained following the respective steps in the manufacturing method according to the embodiment of the disclosure are shown in FIGS. 6a-6d and FIG. 2b.

Figure 6A:
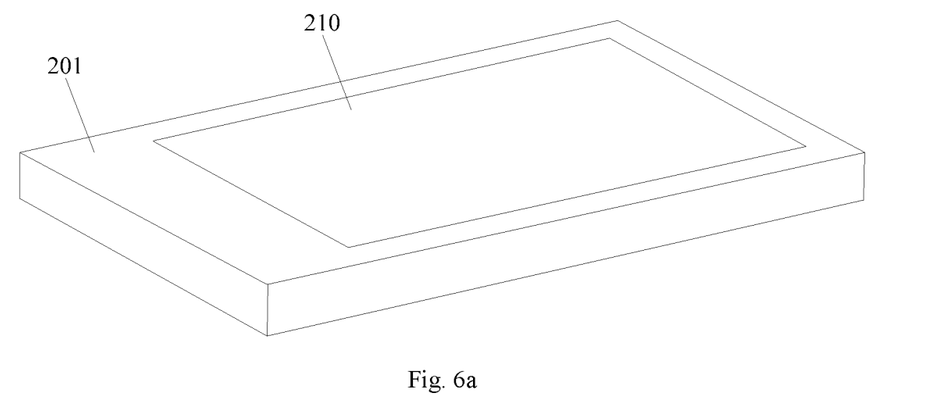
FIGS. 6a-6d are schematic structural views of corresponding display panels following the respective steps in a method for manufacturing a display panel according to an embodiment of the disclosure, respectively.

The display substrate 201 is provided and the polarizer 210 is attached at the display area of the display face of the display substrate 201, as shown in FIG. 6a.

Figure 6B:
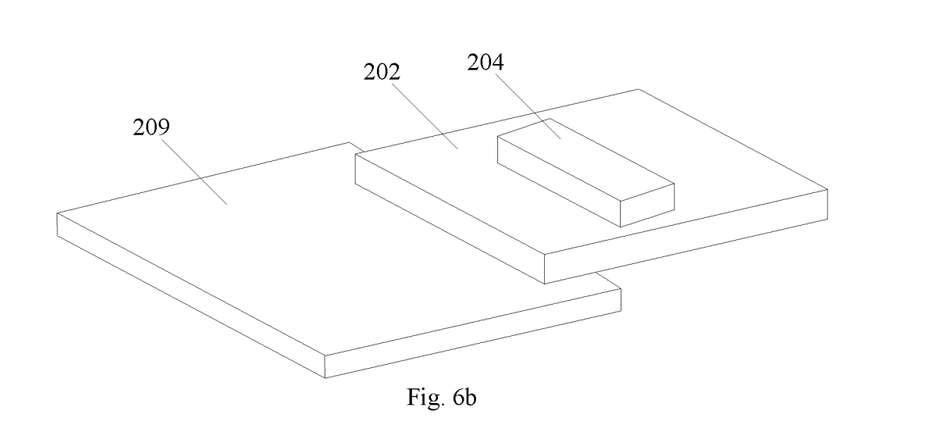

The integrated circuit chip 204 is mounted on the chip-on-film 202, and simultaneously the flexible printed circuit 209 is bonded at the side of the chip-on-film 202 away from the integrated circuit chip 204, as shown in FIG. 6b.

Figure 6C:
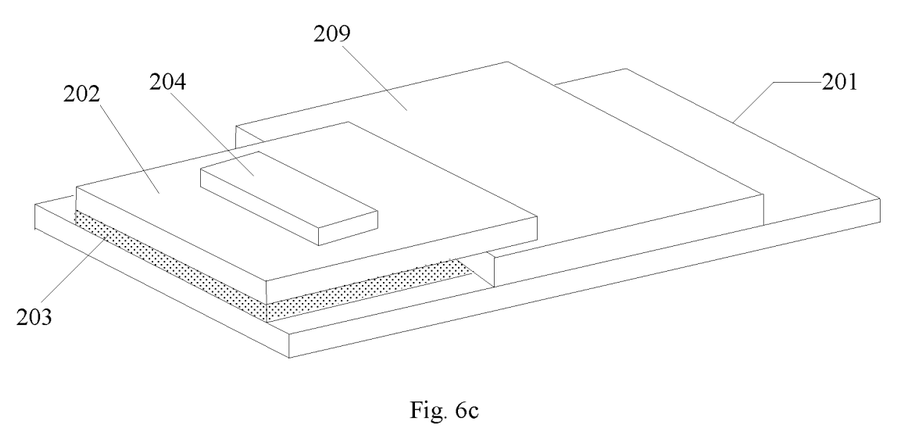

The chip-on-film 202 is attached at the bezel away from the display face of the display substrate 201 by insulation adhesive, with the integrated circuit chip 204 being positioned at a side of the chip-on-film 202 away from the display substrate 201, as shown in FIG. 6c.

Figure 6D:
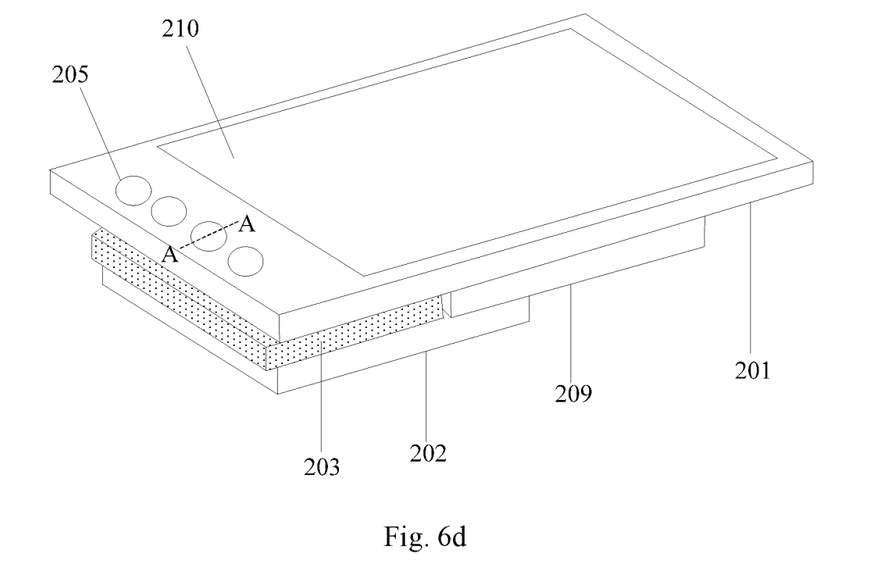

The laser drilling process is used to form the plurality of connection holes 205 penetrating through the display substrate 201 and the insulation adhesive 203 at the bezel at the display face of the display substrate 201, as shown in FIGS. 6d and 7.

The connection holes 205 may correspond one to one to the connection terminals 208 at the side of the chip-on-film 202 away from the display substrate 201, and the size of the connection terminals 208 is larger than the aperture d of the connection holes 205.

The conductive material 206 is filled into the respective connection holes 205 such that the signal lines 207 at the bezel at the display face of the display substrate 201 are connected with the connection terminals 208 provided at the side of the chip-on-film 202 facing the display substrate 201 by the conductive material 206, as shown in FIG. 2b.

Based on the same inventive concept, in an embodiment of the disclosure there is also provided a display device comprising the display panel according to an embodiment of the disclosure. The display device may be a mobile phone, a tablet computer, a TV, a displayer, a notebook computer, a digital photo frame, a navigator and any product or component having display function. The embodiments of the display panel may be referred to for embodiment of the display device. The repeated contents will not be described.

The display panel, display device and method for manufacturing display panel according to embodiments of the disclosure comprise a display substrate, a chip-on-film provided at a bezel away from a display face of the display substrate, an insulation adhesive filled between the display substrate and the chip-on-film, and an integrated circuit chip fixed at a side of the chip-on-film away from the display substrate, wherein the chip-on-film is fixed at the bezel away from the display face of the display substrate by the insulation adhesive, at the bezel there are a plurality of connection holes penetrating through the display substrate and the insulation adhesive and conductive material filled in the respective connection holes, and signal lines at the bezel at the display face of the display substrate are connected with connection terminals provided at a side of the chip-on-film facing the display substrate via the conductive material. Since the insulation adhesive is used to attach the chip-on-film at the bezel away from the display face of the display substrate and then the connection between the signal lines at the bezel at the display face of the display substrate and the connection terminals at the side of the chip-on-film facing the display substrate is performed by the conductive material in the plurality of connection holes penetrating through the display substrate and the insulation adhesive, not only is the pad bending process omitted, but also there is not a bent region of pad at the bezel of the display panel, such that the lower bezel of the display panel may become narrower. Moreover, since the connection holes 205 only penetrate through the display substrate 201 and the insulation adhesive 203, surface contact between the conductive material 206 filled in the connection holes 205 and the connection terminals 208 may be achieved, and thus the contact resistance is effectively reduced.

Obviously, those skilled in the art may make various variants and modifications for the disclosure without going beyond the spirit and scope of the disclosure. As such, the modifications and variants for the disclosure, if falling within the scope of the claims of the disclosure and their equivalent techniques, are also intended to be encompassed by the disclosure.

What is claimed is:

1. A display panel comprising a display substrate, a chip-on-film provided at a bezel away from a display face of the display substrate, an insulation adhesive filled between the display substrate and the chip-on-film, and an integrated circuit chip fixed at a side of the chip-on-film away from the display substrate, wherein
   the chip-on-film is fixed at the bezel away from the display face of the display substrate by the insulation adhesive,
   at the bezel there are a plurality of connection holes penetrating through the display substrate and the insulation adhesive, and conductive material filled in the respective connection holes, and
   signal lines at the bezel at the display face of the display substrate are connected with connection terminals provided at a side of the chip-on-film facing the display substrate via the conductive material.

2. The display panel according to claim 1, wherein the connection holes correspond to the connection terminals one to one, and the connection terminals have a size greater than an aperture of the connection holes.

3. The display panel according to claim 2, wherein the aperture of the connections holes is equal to or greater than 25 μm.

4. The display panel according to claim 1, wherein the conductive material is a metal material.

5. The display panel according to claim 1, wherein the display substrate is an organic light emitting diode or a quantum dot light emitting diode.

6. The display panel according to claim 1, further comprising a flexible printed board bonded at the side of the chip-on-film facing the display substrate.

7. A display device comprising the panel according to claim 1.

8. The display panel according to claim 2, further comprising a flexible printed board bonded at the side of the chip-on-film facing the display substrate.

9. The display panel according to claim 3, further comprising a flexible printed board bonded at the side of the chip-on-film facing the display substrate.

10. The display panel according to claim 4, further comprising a flexible printed board bonded at the side of the chip-on-film facing the display substrate.

11. The display panel according to claim 5, further comprising a flexible printed board bonded at the side of the chip-on-film facing the display substrate.

12. The display device according to claim 7, wherein the connection holes correspond to the connection terminals one to one, and the connection terminals have a size greater than an aperture of the connection holes.

13. The display device according to claim 7, wherein the aperture of the connections holes is equal to or greater than 25 μm.

14. The display panel according to claim 7, wherein the conductive material is a metal material.

15. The display panel according to claim 7. wherein the display substrate is an organic light emitting diode or a quantum dot light emitting diode.

16. The display panel according to claim 7. further comprising a flexible printed board bonded at the side of the chip-on-film facing the display substrate.

* * * * *